(12) United States Patent
Ikedo

(10) Patent No.: US 7,592,812 B2
(45) Date of Patent: Sep. 22, 2009

(54) MAGNETIC RESONANCE IMAGING APPARATUS AND STATIC MAGNETIC FIELD CORRECTION METHOD

(75) Inventor: Masato Ikedo, Otawara (JP)

(73) Assignees: Kabushiki Kaisha Toshiba, Tokyo (JP); Toshiba Medical Systems Corporation, Otawara-shi, Tochigi (JP)

( * ) Notice: Subject to any disclaimer, the term of this patent is extended or adjusted under 35 U.S.C. 154(b) by 0 days.

(21) Appl. No.: 11/729,841

(22) Filed: Mar. 30, 2007

(65) Prior Publication Data

US 2007/0241755 A1    Oct. 18, 2007

(30) Foreign Application Priority Data

Apr. 13, 2006    (JP)    ............................. 2006-111199

(51) Int. Cl.
*G01V 3/00*    (2006.01)
(52) U.S. Cl. ........................ 324/320; 324/319
(58) Field of Classification Search ................. 324/320, 324/319
See application file for complete search history.

(56) References Cited

U.S. PATENT DOCUMENTS

| | | | |
|---|---|---|---|
| 4,740,753 A | | 4/1988 | Glover et al. |
| 4,761,614 A | | 8/1988 | Prammer et al. |
| 5,006,804 A | * | 4/1991 | Dorri et al. ................. 324/320 |
| 5,373,239 A | * | 12/1994 | Marek et al. ................. 324/320 |
| 5,617,029 A | * | 4/1997 | Schneider ................... 324/320 |
| 5,773,976 A | | 6/1998 | Sakakura et al. |

| | | |
|---|---|---|
| 2007/0035302 A1 | 2/2007 | Ikedo et al. |

FOREIGN PATENT DOCUMENTS

| | | |
|---|---|---|
| JP | 2004-73660 | 3/2004 |

OTHER PUBLICATIONS

U.S. Appl. No. 11/653,430, filed Jan. 16, 2007; inventors: Kuhara et al.
Extended European Search Report mailed Nov. 20, 2008 for Application No. EP 07 00 6823.4.
Wen H. et al., "An in Vivo Automated Shimming Method Taking into Account Shim Current Constrains," Magnetic Resonance in Medicine, Academic Press, Duluth, MN, US, vol. 34, No. 6, Dec. 1, 1995, pp. 898-904, XP 000556172, ISSN 0740-3194.
Webb P. et al., "Rapid, Fully Automatic, Arbitrary-Volume in Vivo Shimming," Magnetic Resonance in Medicine, Academic Press, Duluth, MN, US, vol. 20, No. 1, Jul. 1, 1991, pp. 113-122, XP 000219240, ISSN 0740-3194.

(Continued)

*Primary Examiner*—Louis M Arana
(74) *Attorney, Agent, or Firm*—Nixon & Vanderhye P.C.

(57) ABSTRACT

A magnetic resonance imaging apparatus includes: a static magnetic field generating unit which generates a static magnetic field, a measuring unit which measures the strength distribution characteristic of the static magnetic field, a determination unit which determines correction amounts for first- to nth-order (n is a natural number of more than one) components of the strength distribution characteristic of the static magnetic field by fixing the correction amount for at least one specific component which are part of the first- to nth-order components at a predetermined amount and determining the correction amounts for other components than the specific component on the basis of the strength distribution characteristic, and a correction magnetic field generating unit which generates correction magnetic fields to correct the static magnetic field on the basis of the correction amounts.

12 Claims, 3 Drawing Sheets

OTHER PUBLICATIONS

Shen J. et al., "Linear Projection Method for Automatic Slice Shimming," Magnetic Resonance in Medicine, Academic Press, Duluth, MN, US, vol. 42, Jan. 1, 1999, pp. 1082-1088, XP 002294863, ISSN 0740-3194.

Chilvers P. B. et al., "Automated Shimming with Normal Spectrometer Hardware: 3D Profile Edge Shimming," Journal of Magnetic Resonance, Academic Press, Orlando, FL, US., vol. 133, No. 1, Jul. 1, 1998, pp. 210-215, XP004407438, ISSN 1090-7807.

* cited by examiner

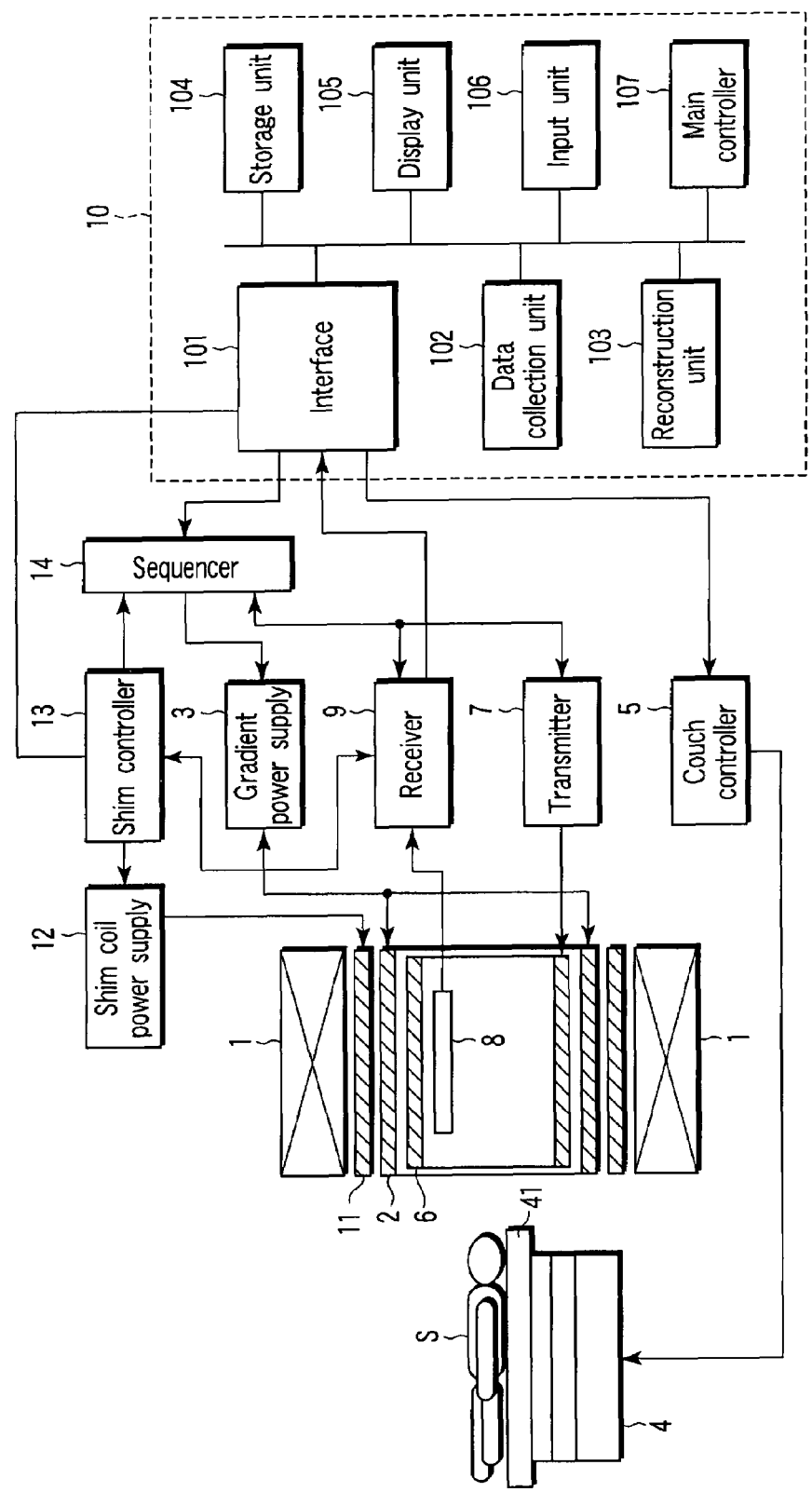
F I G. 1

MAGNETIC RESONANCE IMAGING APPARATUS AND STATIC MAGNETIC FIELD CORRECTION METHOD

CROSS-REFERENCE TO RELATED APPLICATIONS

This application is based upon and claims the benefit of priority from prior Japanese Patent Application No. 2006-111199, filed Apr. 13, 2006, the entire contents of which are incorporated herein by reference.

BACKGROUND OF THE INVENTION

1. Field of the Invention

The present invention relates to a magnetic resonance imaging apparatus having a function of correcting nonuniform components of a static magnetic field and a static magnetic field correction method for use with the magnetic resonance imaging apparatus.

2. Description of the Related Art

The magnetic resonance imaging (MRI) requires very high uniformity in the static magnetic field in various imaging methods. The so-called shimming is important to correct nonuniformity in the static magnetic field. The shimming is roughly divided into passive shimming and active shimming. The passive shimming is adapted to make uniform the static magnetic field in an imaging region by placing shims in the static magnetic field generated by a static field magnet. The active shimming is adapted to make uniform the static magnetic field in the imaging region by superimposing correction magnetic fields generated by shim coils upon the static magnetic field generated by the static field magnet. In the recent magnetic resonance imaging, the active shimming is important. In the description which follows, we shall describe the active shimming and refer to it simply as shimming.

The nonuniformity of the static magnetic field can be represented by dividing it into components, such as zeroth-order components $X^0, Y^0$ and $Z^0$, first-order components $X^1, Y^1$ and $Z^1$, and second-order components $X^2, Y^2, Z^2, XY, ZY$ and $ZX$. There also exists higher-order components, such as third-order components, fourth-order components, etc.

In general, the shimming is performed for each of the nonuniform components described above. Since a shim coil is needed for each of the components to be corrected, correction is generally made on a limited number of components, such as components through first-order components or components through second-order components.

For shimming calculations, a collection of signals is actually made to measure a magnetic field distribution in a region of interest, then the resulting magnetic field distribution is expanded into magnetic field components set as objects of shimming, and correction magnetic fields are determined which cancel out the nonuniform components of the static magnetic field. To generate these correction magnetic fields, a current value to be applied to a respective one of the shim coils, i.e., a correction value, is calculated. Assume, for example, that the reference value of the strength of a uniform magnetic field is B0 and shimming is performed on the basis of a magnetic field distribution including components through first-order components. For more simplicity, assume that only the Z direction is considered in the expanded expression of the magnetic field distribution. Then, from an expression, $C_1 Z + C_0 + B_0$, resulting from expansion of the magnetic field distribution into zeroth- and first-order components, the correction value for the first-order component is given as $-C_1$ and the correction value for the zeroth-order component is given as $-C_0$.

A conventional technique relating to shimming is disclosed in U.S. Pat. No. 4,740,753.

Since the current which can be set up on each shim coil has an upper limit, if the shimming correction value exceeds the allowable upper limit, proper correction will not be made. Even in this case, since the magnetic field distribution is expanded into components, the shimming correction values could be determined; however, since these values are the results of calculations under constraints of allowable current values of the shim coils, determined correction magnetic fields might not conform to the actual magnetic field distribution.

BRIEF SUMMARY OF THE INVENTION

In view of such circumstances, the demand has increased for obtaining proper correction magnetic fields to increase the uniformity of a static magnetic field.

According to a first aspect of the invention, there is provided a magnetic resonance imaging apparatus comprising: a static magnetic field generating unit which generates a static magnetic field; a measuring unit which measures the strength distribution characteristic of the static magnetic field; a determination unit which determines correction amounts for first- to nth-order (n is a natural number of more than one) components of the strength distribution characteristic of the static magnetic field by fixing the correction amount for at least one specific component which is part of the first- to nth-order components at a predetermined amount and determining the correction amounts for other components than the at least one specific component on the basis of the strength distribution characteristic; and a correction magnetic field generating unit which generates correction magnetic fields to correct the static magnetic field on the basis of the correction amounts.

According to a second aspect of the invention, there is provided a magnetic resonance imaging apparatus comprising: a static magnetic field generating unit which generates a static magnetic field; a measuring unit which measures the strength distribution characteristic of the static magnetic field; a first determination unit which determines correction amounts for first- to nth-order (n is a natural number of more than one) components of the strength distribution characteristic of the static magnetic field by fixing the correction amount for at least one specific component which is part of the first- to nth-order components at a predetermined amount and determining the correction amounts for other components than the at least one specific component on the basis of the strength distribution characteristic; a second determination unit which determines the correction amount for each of the first- to nth-order components on the basis of the strength distribution characteristic; a selection unit which selects each of the correction amounts determined by the first determination unit when it is less than a threshold and selects each of the correction amounts determined by the second determination unit when the corresponding correction amount determined by the first determination unit is more than a threshold; and a correction magnetic field generating unit which generates correction magnetic fields to correct the static magnetic field on the basis of the selected correction amounts.

According to a third aspect of the invention, there is provided a magnetic resonance imaging apparatus comprising: a static magnetic field generating unit which generates a static magnetic field; a measuring unit which measures the strength distribution characteristic of the static magnetic field; a determination unit which determines correction amounts for first- to nth-order (n is a natural number of more than one) components of the strength distribution characteristic of the static magnetic field by fixing the correction amount for at least one specific component which is part of the first- to nth-order components at a predetermined amount and determining the correction amounts for other components than the at least one specific component on the basis of the strength distribution characteristic; a selection unit which selects a set of correction amounts from among a plurality of sets of correction amounts which are determined by causing the determination unit to perform the process of determining correction amounts a plurality of times; and a correction magnetic field generating unit which generates correction magnetic fields to correct the static magnetic field on the basis of the correction amounts included in a selected set of correction amount.

According to a fourth aspect of the invention, there is provided a static magnetic field correction method comprising the steps of: measuring the strength distribution characteristic of a static magnetic field generated by a static magnetic field generating unit; determining correction amounts for first- to nth-order (n is a natural number of more than one) components of the strength distribution characteristic of the static magnetic field by fixing the correction amount for at least one of specific component which is part of the first- to nth-order components at a predetermined amount and determining the correction amounts for other components than the at least one specific component on the basis of the strength distribution characteristic; and generating correction magnetic fields to correct the static magnetic field on the basis of the correction amounts.

According to a fifth aspect of the invention, there is provided a static magnetic field correction method comprising the steps of: measuring the strength distribution characteristic of a static magnetic field generated by a static magnetic field generating unit; determining first correction amounts for first- to nth-order (n is a natural number of more than one) components of the strength distribution characteristic of the static magnetic field by fixing the correction amount for at least one of specific component which are part of the first- to nth-order components at a predetermined amount and determining the correction amounts for other components than the specific components on the basis of the strength distribution characteristic; determining second correction amount for each of the first- to nth-order components on the basis of the strength distribution characteristic; selecting each of the first correction amounts when it is less than a threshold and selecting each of the second correction amounts when the corresponding first correction amount is more than a threshold; and generating correction magnetic fields to correct the static magnetic field on the basis of the selected correction amounts.

According to a sixth aspect of the invention, there is provided a static magnetic field correction method comprising the steps of: measuring the strength distribution characteristic of a static magnetic field generated by a static magnetic field generating unit; determining correction amounts for first- to nth-order (n is a natural number of more than one) components of the strength distribution characteristic of the static magnetic field by fixing the correction amount for at least one of specific component which is part of the first- to nth-order components at a predetermined amount and determining the correction amounts for other components than the at least one specific component on the basis of the strength distribution characteristic; selecting a set of correction amounts from among a plurality of sets of correction amounts which are determined by causing the determination unit to perform the process of determining correction amounts a plurality of times; and generating correction magnetic fields to correct the static magnetic field on the basis of the amount included in a selected set of correction amount.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic and block diagram representation of a magnetic resonance imaging (MRI) apparatus according to an embodiment of the invention;

DETAILED DESCRIPTION OF THE INVENTION

Figure 2:
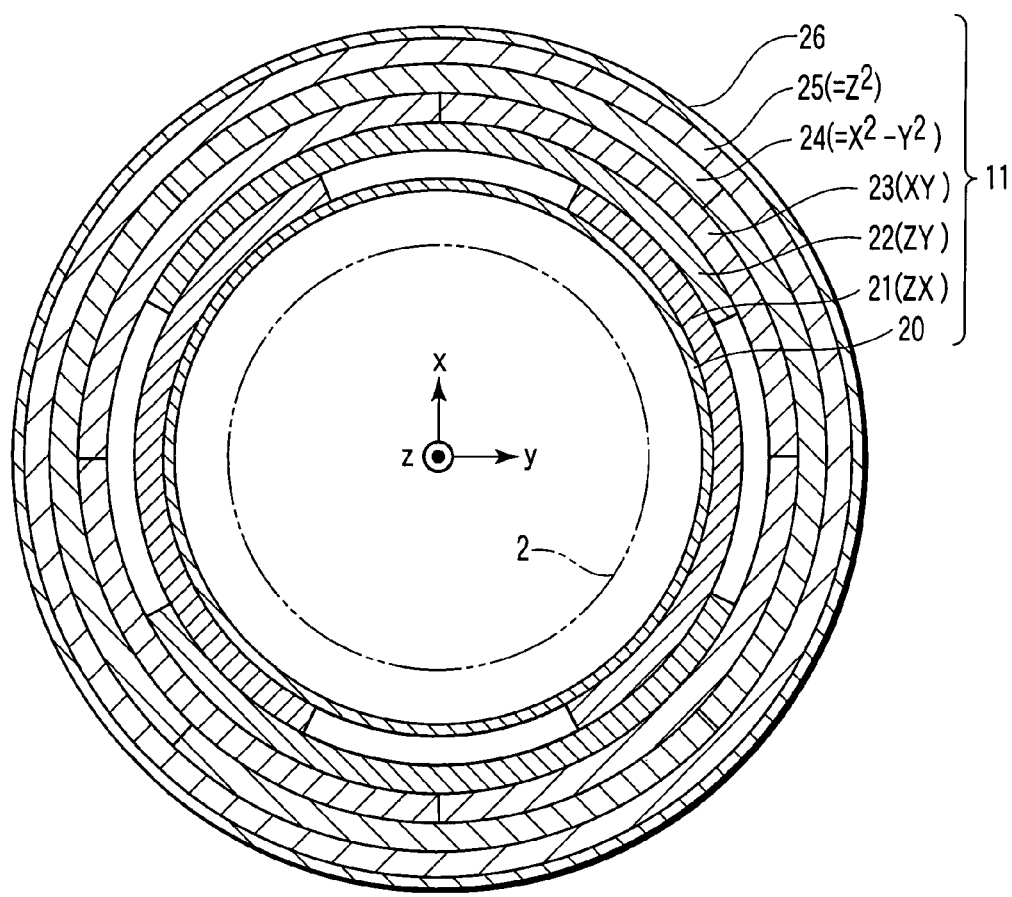
FIG. 2 is a schematic cross-sectional view of the shim coil unit shown in FIG. 1.

An embodiment of the present invention will be described hereinafter with reference to the accompanying drawings.

FIG. 1 shows the configuration of a magnetic resonance imaging apparatus (MRI apparatus) embodying the invention. The MRI apparatus shown in FIG. 1 includes a static field magnet 1, a gradient coil unit 2, a gradient power supply 3, a couch 4, a couch controller 5, a transmitting RF coil unit 6, a transmitter 7, a receiving RF coil unit 8, a receiver 9, a computer system 10, a shim coil unit 11, a shim coil power supply 12, a shim controller 13, and a sequencer 14.

The static field magnet 1, which is formed in the shape of a hollow cylinder, generates a uniform static magnetic field in its inside space. As the static field magnet 1 use is made of, for example, a permanent magnet or a superconducting magnet.

The gradient coil unit 2 is formed in the shape of a hollow cylinder and placed inside the static field magnet 1. The gradient coil unit 2 is composed of three coils each of which corresponds to a respective one of the three mutually orthogonal X, Y, and Z axes. Each of the three coils is separately driven by the gradient power supply 3 to generate a gradient magnetic field having its strength varied along a corresponding one of the X, Y, and Z axes. Suppose, for example, that the Z-axis direction is coincident with the direction of the static magnetic field. The gradient magnetic fields in the X, Y and Z-axis directions correspond to a slice-selection gradient magnetic field Gs, a phase-encoding gradient field Gr, and a readout gradient field Gr, respectively. The slice-selection gradient magnetic field Gs is used to arbitrarily determine an imaging slice. The phase-encoding gradient magnetic field Ge is used to change the phase of a magnetic resonance signal according to spatial position. The readout gradient magnetic field Gr is used to change the frequency of a magnetic resonance signal according to spatial position.

The static field magnet 1 and the gradient coil unit 2 are housed in a gantry, which is formed with a cavity inside the gradient coil unit 2. The inside of that cavity forms an imaging area where a patient is to be imaged.

A subject S under examination is laid down on a top board of the couch 4 and moved into the imaging area. The top board 41 of the couch 4 is driven by the couch controller 5 to move in the direction of its length and in an up-and-down direction. Usually, the couch 4 is set so that the direction of its length is parallel to the central axis of the static field magnet 1.

The transmitting RF coil unit 6 has at least one coil built in and is placed inside the gradient coil unit 2. The transmitting RF coil unit 6 receives radio-frequency pulses from the transmitter 7 to generate a radio-frequency magnetic field (rotating magnetic field).

The transmitter 7 transmits the radio-frequency pulses corresponding to a Lamor frequency to the transmitting RF coil unit 6.

The receiving RF coil unit 8 has at least one coil built in and is placed inside the gradient coil unit 2. The receiving RF coil unit 8 receives a radio-frequency magnetic resonance signal emitted from the patient in the process of relaxation of desired nuclear spins excited by the radio-frequency magnetic field generated by the transmitting RF coil unit 6. The output signal of the receiving RF coil unit 8 is input to the receiver 9. Note that a single coil unit may be used both as the receiving RF coil unit 8 and as the transmitting RF coil unit 6.

The receiver 9 performs amplification, quadrature phase demodulation, and analog-to-digital conversion in turn on the magnetic resonance signal output from the receiving RF coil unit 9 to provide magnetic resonance signal data.

The computer system 10 includes an interface 101, a data collection unit 102, a reconstruction unit 103, a storage unit 104, a display unit 105, an input unit 106, and a main controller 107.

To the interface 101 are connected the gradient power supply 3, the couch control unit 5, the transmitter 7, the receiving RF coil unit 8, and the receiver 9. The interface 101 is adapted to transmit data between each of those components and the computer system 10.

The data collection unit 102 collects a digital signal output from the receiver 9 via the interface 101 and then stores the collected digital signal, i.e., magnetic resonance signal data, into the storage unit 104.

The reconstruction unit 103 carries out postprocessing, i.e., a reconstruction process, such as Fourier transform, on the magnetic resonance signal data stored in the storage unit 104 and obtains spectrum data of desired nuclear spins within the subject S under examination or image data.

The storage unit 104 stores magnetic resonance signal data and spectrum data or image data for each patient.

The display unit 105 displays various pieces of information, such as spectrum data or image data, under the control of the main controller 107. As the display unit 105, use may be made of a display device, such as a liquid crystal display device.

The input unit 106 accepts various instructions and information inputs from an operator. As the input unit 106, use may be made of a pointing device, such as a mouse or a trackball, a selective device, such as a mode changeover switch, or an input device, such as a keyboard.

The main controller 107 includes a CPU and a memory not shown and controls the entire MRI apparatus.

The objects of correction by the shim coil unit 11 are high-order nonuniform magnetic field components which the field uniformity correction (FUC) method does not intend to correct directly or indirectly. The shim coil unit 11 includes a number of shim coils each of which is adapted to correct a different nonuniform component of the static magnetic field.

FIG. 2 is a cross-sectional view of the shim coil unit 11 in which the shim coils are stacked on top of one another.

In FIG. 1, the gradient coil unit 2 and the shim coil unit 11 are illustrated spaced apart from each other to distinguish them with ease; however, in practice, the shim coil unit 11 is bonded to the outer surface of the gradient coil unit 2 with no gap therebetween.

The shim coil unit 11 is formed, as shown in FIG. 2, into a second-order shim structure of "ZX", "ZY", "XY", "$X^2$-$Y^2$", and "$Z^2$". In more detail, the shim coil unit includes an inside resin layer 20, shim coils 21, 22, 23, 24 and 25, and a resin tape layer 26.

The inside resin layer 20 is formed in the shape of a cylinder on the outer surface of the gradient coil unit 2. Each of the shim coils 21, 22, 23, 24 and 25 is formed such that a flexible substrate is shaped into a desired coil pattern on an insulating base. The shim coils 21, 22, 23, 24 and 25 are stacked in this order on the outer surface of the inside resin layer 20. The shim coil 21 has a coil pattern to generate a magnetic field in substantially the same direction as the ZX component of the static magnetic field generated by the static field magnet 1. The shim coil 22 has a coil pattern to generate a magnetic field in substantially the same direction as the ZY component of the static magnetic field generated by the static field magnet 1. The shim coil 23 has a coil pattern to generate a magnetic field in substantially the same direction as the XY component of the static magnetic field generated by the static field magnet 1. The shim coil 24 has a coil pattern to generate a magnetic field in substantially the same direction as the $X^2$-$Y^2$ component of the static magnetic field generated by the static field magnet 1. The shim coil 25 has a coil pattern to generate a magnetic field in substantially the same direction as the $Z^2$ component of the static magnetic field generated by the static field magnet 1. The resin tape layer 26 is formed by winding resin tape onto the outer surface of the shim coil 25. The rein tape layer 26 serves to protect and insulate the shim coils 21, 22, 23, 24 and 25.

The shim coil unit 11 having such a structure as shown in FIG. 2 is described in detail in U.S. Pat. No. 5,773,976, the contents of which are incorporated herein by reference.

The shim coil unit 11 thus arranged is capable of generating 5-channel correction magnetic fields. Shim coil units having more shim coils have also been realized which are capable of 13- or 18-channel correction magnetic fields.

The shim coil power supply 12 separately applies a current (shim current) to each of the shim coils of the shim coil unit 11. The shim coil power supply 12 sets the magnitudes of the shim currents according to shimming values output from the shim controller 13.

The shim controller 13 takes in magnetic resonance signal data from the receiver 9, then determines a spatial magnetic field distribution on the basis of that data, and determines a shimming value (correction amount) for each component on the basis of that magnetic field distribution. The shim controller 13 supplies the shim coil power supply 12 with shimming values for nonuniform components to be corrected by the shim coil unit 11, the shimming values being changed according to the shift of partial regions from which data are to be collected. The shim controller 13 supplies the sequencer 14 with shimming values for first-order nonuniform components as offset values while changing them according to shift of the partial regions from which data are to be collected. Further, the shim controller 13 shims zeroth-order components by adjusting the reference frequency in quadrature phase detection in the receiver 9 according to shimming values for deviation of the zeroth-order components, that is, resonant frequency.

The sequencer 14 controls the timing of operations of the transmitter 7, the receiver 8, and the gradient power supply 3 to carry out a pulse sequence for determining the shimming values or a pulse sequence for imaging. In performing the pulse sequence for imaging, the sequencer 14 adds the offset values to a reference value and provides the results of addition to the gradient power supply 3. The gradient power supply then supplies the gradient coils corresponding to the X, Y and Z axes with gradient magnetic field currents corresponding to the results of addition, whereby the first-order components are shimmed.

The operation of the MRI apparatus configured as described above will be described next.

The embodiment is directed to both shim coil-based shimming and shimming, called the FUC method, in which offsets are introduced into the gradient magnetic fields. In the FUC method, an offset is applied on the gradient magnetic field corresponding to each of the X, Y and Z axes to thereby directly correct the first-order nonuniform components of the static magnetic field. This embodiment uses the FUC method to allow higher-order nonuniform components, i.e., the second-order nonuniform components, to be corrected indirectly. This embodiment allows components other than nonuniform components that the shim coils directly correct as in the FUC method to be corrected indirectly.

The method of determining a shimming value will be described next.

The methods for determining a shimming value include the following:

(1) A magnetic resonance signal is obtained from an object region without superimposing gradient magnetic fields. A shim current value which the time constant with which the signal decays is longest is determined.

(2) A magnetic resonance signal is obtained from an object region without superimposing gradient magnetic fields. The magnetic resonance signal is Fourier converted and then a shim current value for which the frequency band of the converted data is minimum is determined.

(3) A spatial magnetic field distribution is determined as a phase map. The magnetic field distribution is expanded (decomposed) into magnetic field components which are objects of shimming and then a shim current value is determined for each magnetic field component, which is required to obtain such a strength of a magnetic field as allows the magnetic field distribution to be stable.

The best one of these methods is the method (3). The embodiment is therefore based on the method (3). With this method, a region of interest is a slice which is very small in thickness, of the order of, say, 3 mm. Considering that the slice direction is the most common Z direction, determining a shim current value for the nonuniform component in the Z direction from a magnetic field distribution in a thin slice alone may result in lowered accuracy. In the embodiment, this problem is solved by determining the shim current value from a magnetic field distribution in a wide region, that is, in the whole of a number of slices.

Figure 3:
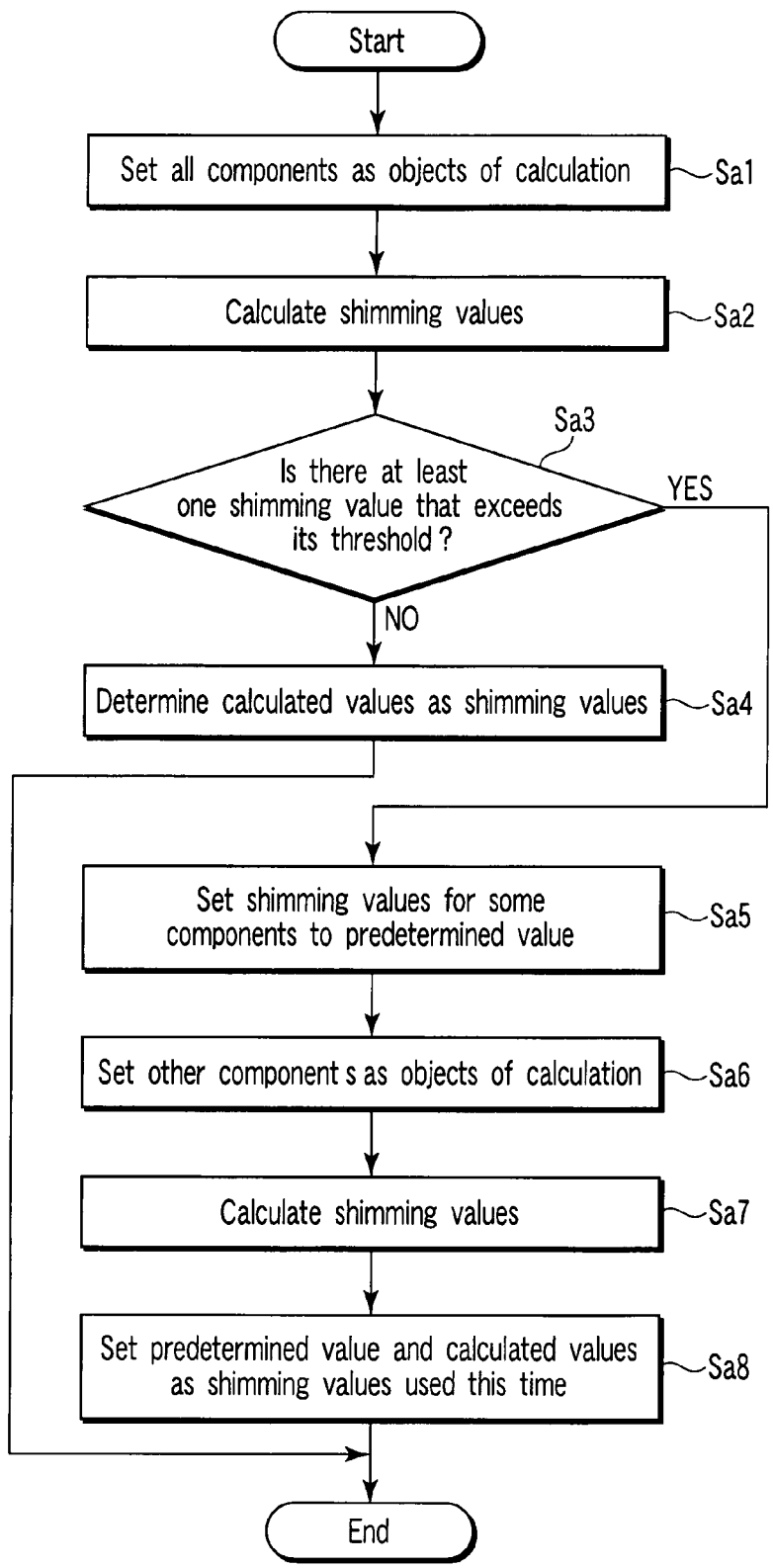
FIG. 3 is a flowchart illustrating the procedure of determining shimming values by the shim controller in FIG. 1.

FIG. 3 is a flowchart for the procedure of determining shimming values by the shim controller 13.

In step Sa1, the shim controller 13 sets all the components to be corrected as objects of calculation of shimming values. In step Sa2, the shim controller 13 calculates a shimming value for each of the components to be corrected. For calculation of the shimming values, a known process can be used. In step Sa3, the shim controller 13 confirms whether or not at least one of the shimming values thus determined exceeds its threshold (a threshold is preset for each of the components to be corrected). Each threshold is set to a value corresponding to the maximum current value the shim coil power supply 12 can apply to a respective corresponding one of the shim coils of the shim coil unit 11 or to a value slightly smaller than that value.

If there is no shimming value that exceeds its threshold, then the shim controller 13 goes from step Sa3 to step Sa4. In step Sa4, the shim controller 13 determines the values calculated as described above as shimming values used in this shimming process.

If, on the other hand, there is at least one shimming value that exceeds its threshold, then the shim controller 13 goes from step Sa3 to step Sa5. In step Sa5, the shim controller 13 sets each of the shimming values for at least one of the component to be corrected to a predetermined value. In step Sa6, the shim controller 13 sets the other components as objects of calculation. In step Sa7, the shim controller 13 calculates a shimming value for each of the components which have been set as objects of calculation under the condition that some of the shimming values have been set to the predetermined value. In step Sa8, the shim controller 13 sets the predetermined value for some components and the values calculated in step Sa7 as the shimming values used in this shimming process.

Some of the components can be taken to be the components for which the values calculated in step Sa2 exceed thresholds or to be higher-order components. The predetermined value can be taken as 0 by way of example.

When the stable shimming cannot be achieved by the conventional method to directly correct all the components, this embodiment can make indirect correction on a limited number of components to increase the stability of shimming.

It would also be possible to set the predetermined value to a values of the order of a threshold and correct some of the components to a possible extent; however, setting the predetermined value to 0 to set the correction amount for some of the components to 0 and making correction on the other components as in this embodiment will allow the static magnetic field to be corrected properly.

Various modifications of this embodiment are possible as follows:

Steps Sa1 through Sa4 may be omitted, in which case the shimming values for at least one of the component are fixed at a predetermined value from the beginning. For example, by fixing the shimming value of the ZX component at a certain value, fixing the shimming values of high-order components of not less than second-order other than the ZX component at 0, and determining the shimming values for the remaining components, it becomes possible to indirectly correct the ZX component and the high-order components with only the ZX component and components of less than second-order. Furthermore, fixing components of a certain order at 0, and determining the shimming values for the other components, it becomes possible to indirectly correct the components of a certain order with the other components. Thus, the inventive method can increase the degree of freedom in combination of components in shimming corrections.

In order to find solutions which provide higher magnetic field uniformity than with correction values determined through one-time calculations, in the case of shimming components through the second-order components, the process of first determining the shimming values of the components except the second-order components with the shimming value of the second-order components set to 0 and then determining the shimming value of the second-order components with the shimming values of those remaining components fixed may be repeated several times. Of course, in each shimming calculation, it is optional which component to fix at what value. Thereby, when the optimum solutions cannot be obtained through one-time calculations, more converged solutions can be determined by repeating calculations, thus allowing the stability of shimming to be enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
    a static magnetic field generating unit which generates a static magnetic field;
    a measuring unit which measures the strength distribution characteristic of the static magnetic field;
    a determination unit which determines correction amounts for first- to nth-order (n is a natural number of more than one) components of the strength distribution characteristic of the static magnetic field by fixing the correction amount for at least one specific component which is part of the first- to nth-order components at a predetermined amount and determining the correction amounts for other components than the at least one specific component on the basis of the strength distribution characteristic; and
    a correction magnetic field generating unit which generates correction magnetic fields to correct the static magnetic field on the basis of the correction amounts.

2. The apparatus according to claim 1, wherein the predetermined amount is zero.

3. The apparatus according to claim 1, wherein the correction magnetic field generating unit includes a number of shim coils each of which generates a respective one of the correction magnetic fields corresponding to the first- to nth-order components, and
    a supply unit which supplies the shim coils with currents each of which has a magnitude which corresponds to a respective one of the correction amounts.

4. A magnetic resonance imaging apparatus comprising:
    a static magnetic field generating unit which generates a static magnetic field;
    a measuring unit which measures the strength distribution characteristic of the static magnetic field;
    a first determination unit which determines correction amounts for first- to nth-order (n is a natural number of more than one) components of the strength distribution characteristic of the static magnetic field by fixing the correction amount for at least one specific component which is part of the first- to nth-order components at a predetermined amount and determining the correction amounts for other components than the at least one specific component on the basis of the strength distribution characteristic;
    a second determination unit which determines the correction amount for each of the first- to nth-order components on the basis of the strength distribution characteristic;
    a selection unit which selects each of the correction amounts determined by the first determination unit when it is less than a threshold and selects each of the correction amounts determined by the second determination unit when the corresponding correction amount determined by the first determination unit is more than a threshold; and
    a correction magnetic field generating unit which generates correction magnetic fields to correct the static magnetic field on the basis of the selected correction amounts.

5. The apparatus according to claim 4, wherein the predetermined amount is zero.

6. The apparatus according to claim 4, wherein the correction magnetic field generating unit includes a number of shim coils each of which generates a respective one of the correction magnetic fields corresponding to the first- to nth-order components, and
    a supply unit which supplies the shim coils with currents each of which has a magnitude which corresponds to a respective one of the correction amounts.

7. A magnetic resonance imaging apparatus comprising:
    a static magnetic field generating unit which generates a static magnetic field;
    a measuring unit which measures the strength distribution characteristic of the static magnetic field;
    a determination unit which determines correction amounts for first- to nth-order (n is a natural number of more than one) components of the strength distribution characteristic of the static magnetic field by fixing the correction amount for at least one specific component which is part of the first- to nth-order components at a predetermined amount and determining the correction amounts for other components than the at least one specific component on the basis of the strength distribution characteristic;
    a selection unit which selects a set of correction amounts from among a plurality of sets of correction amounts which are determined by causing the determination unit to perform the process of determining correction amounts a plurality of times; and
    a correction magnetic field generating unit which generates correction magnetic fields to correct the static magnetic field on the basis of the correction amounts included in a selected set of correction amount.

8. The apparatus according to claim 7, wherein the predetermined amount is zero.

9. The apparatus according to claim 7, wherein the correction magnetic field generating unit includes a number of shim coils each of which generates a respective one of the correction magnetic fields corresponding to the first- to nth-order components, and
    a supply unit which supplies the shim coils with currents each of which has a magnitude which corresponds to a respective one of the correction amounts.

10. A static magnetic field correction method comprising the steps of:
    measuring the strength distribution characteristic of a static magnetic field generated by a static magnetic field generating unit;
    determining correction amounts for first- to nth-order (n is a natural number of more than one) components of the strength distribution characteristic of the static magnetic field by fixing the correction amount for at least one specific component which is part of the first- to nth-order components at a predetermined amount and determining the correction amounts for other components than the at least one specific component on the basis of the strength distribution characteristic; and
    generating correction magnetic fields to correct the static magnetic field on the basis of the correction amounts.

11. A static magnetic field correction method comprising the steps of:

measuring the strength distribution characteristic of a static magnetic field generated by a static magnetic field generating unit;

determining first correction amounts for first- to nth-order (n is a natural number of more than one) components of the strength distribution characteristic of the static magnetic field by fixing the correction amount for at least one specific component which is part of the first- to nth-order components at a predetermined amount and determining the correction amounts for other components than the at least one specific component on the basis of the strength distribution characteristic;

determining second correction amount for each of the first- to nth-order components on the basis of the strength distribution characteristic;

selecting each of the first correction amounts when it is less than a threshold and selecting each of the second correction amounts when the corresponding first correction amount is more than a threshold; and generating correction magnetic fields to correct the static magnetic field on the basis of the selected correction amounts.

12. A static magnetic field correction method comprising the steps of:

measuring the strength distribution characteristic of a static magnetic field generated by a static magnetic field generating unit;

determining correction amounts for first- to nth-order (n is a natural number of more than one) components of the strength distribution characteristic of the static magnetic field by fixing the correction amount for at least one specific component which is part of the first- to nth-order components at a predetermined amount and determining the correction amounts for other components than the at least one specific component on the basis of the strength distribution characteristic;

selecting a set of correction amounts from among a plurality of sets of correction amounts which are determined by causing the determination unit to perform the process of determining correction amounts a plurality of times; and generating correction magnetic fields to correct the static magnetic field on the basis of the amount included in a selected set of correction amount.

\* \* \* \* \*